United States Patent [19]
Angelotti

[11] Patent Number: 5,909,452
[45] Date of Patent: Jun. 1, 1999

[54] METHOD FOR AVOIDING CONTENTION DURING BOUNDARY SCAN TESTING

[75] Inventor: Frank William Angelotti, Rochester, Minn.

[73] Assignee: International Business Machines Corporation, Armonk, N.Y.

[21] Appl. No.: 08/991,373

[22] Filed: Dec. 16, 1997

[51] Int. Cl.$^6$ .................................................. G06F 11/00
[52] U.S. Cl. ........................................................ 371/22.31
[58] Field of Search ............................ 371/22.31, 22.32, 371/22.33, 22.24; 395/183.06

[56] References Cited

U.S. PATENT DOCUMENTS 5,617,430  4/1997  Angelotti et al. ......................... 371/27

OTHER PUBLICATIONS

Angelotti, "Modeling for Structured System Interconnect Test", 1994 IEEE International Test Conference, pp. 127–133.

Angelotti et al., "System Level Interconnect Test in a Tristate Environment", 1993 IEEE International Test Conference, pp. 45–53.

*Primary Examiner*—Vincent P. Canney
*Attorney, Agent, or Firm*—Martin & Associates, L.L.C.; Derek P. Martin

[57] ABSTRACT

According to the present invention, methods for testing interconnections on an electronic assembly in accordance with the disclosed embodiments eliminate some or all signal line contention during boundary scan testing. Each of these methods assumes that a first sequence of test patterns for testing the interconnects has been generated. A method in accordance with the first embodiment determines a safe pattern, and inserts the safe pattern between every two patterns in the first sequence of test patterns to generate a second sequence of test patterns. A method in accordance with the second embodiment analyzes the first sequence of test patterns, determines when a transition between two test patterns may cause possible signal contention, and inserts a safe test pattern between the two to generate a second sequence of test patterns. When a transition between two test patterns may potentially cause contention, the transition is said to be unsafe. The safe test pattern in the second embodiment may be a single safe test pattern for all transitions, or may be a safe test pattern that is derived from the two test patterns that generate the unsafe transition. A method in accordance with the third embodiment analyzes the first sequence of test patterns, reorders the test patterns to minimize the number of unsafe transitions, and then inserts a safe test pattern between patterns at unsafe transitions, if any, to assure that no signal contention occurs during boundary scan testing. The safe test pattern for the third embodiment may be a single test pattern, or may be a test pattern that is derived from the test patterns that generate the unsafe transition.

26 Claims, 14 Drawing Sheets

| Latch | Test1 | Test2 | Test3 | Test4 | Test5 | Test6 | Test7 |
|---|---|---|---|---|---|---|---|
| 1.1 | 0 | 1 | d | d | d | d | d |
| 1.2 | 1 | 1 | 0 | 0 | 0 | 0 | 0 |
| 1.3 | 0 | 1 | d | d | d | d | d |
| 1.4 | 1 | 1 | 0 | 0 | 0 | 0 | 0 |
| 1.5 | 0 | 1 | d | d | d | d | d |
| 1.6 | 1 | 1 | 0 | 0 | 0 | 0 | 0 |
| 2.1 | d | d | 0 | 1 | 0 | 1 | d |
| 2.2 | 0 | 0 | 1 | 1 | 1 | 1 | 0 |
| 2.3 | 0 | 1 | d | d | d | d | d |
| 2.4 | 1 | 1 | 0 | 0 | 0 | 0 | 0 |
| 2.5 | d | d | 0 | 1 | d | d | d |
| 2.6 | 0 | 0 | 1 | 1 | 0 | 0 | 0 |
| 3.1 | d | d | d | d | 0 | 1 | d |
| 3.2 | 0 | 0 | 0 | 0 | 1 | 1 | 0 |
| 3.3 | d | d | 0 | 1 | 0 | 1 | d |
| 3.4 | 0 | 0 | 1 | 1 | 1 | 1 | 0 |
| 3.5 | d | d | 0 | 1 | 0 | 1 | d |
| 3.6 | 0 | 0 | 1 | 1 | 1 | 1 | 0 |

FIG. 13

| | Test1 | Test2 | Test3 | Test4 | Test5 | Test6 | Test7 |
|---|---|---|---|---|---|---|---|
| Net 1 Value | 0 | 1 | 0 | 1 | 0 | 1 | H |
| Net 1 Drivers | {1.1} | {1.1} | {2.5} | {2.5} | {3.1} | {3.1} | { } |
| Net 2 Value | 0 | 1 | 0 | 1 | 0 | 1 | H |
| Net 2 Drivers | {1.3} | {1.3} | {3.3} | {3.3} | {3.3} | {3.3} | { } |
| Net 3 Value | 0 | 1 | 0 | 1 | 0 | 1 | H |
| Net 3 Drivers | {1.5} | {1.5} | {2.1} | {2.1} | {2.1} | {2.1} | { } |
| Net 4 Value | 0 | 1 | 0 | 1 | 0 | 1 | H |
| Net 4 Drivers | {2.3} | {2.3} | {3.5} | {3.5} | {3.5} | {3.5} | { } |

FIG. 14

METHOD FOR AVOIDING CONTENTION DURING BOUNDARY SCAN TESTING

BACKGROUND OF THE INVENTION

1. Technical Field

This invention generally relates to the testing of integrated circuits, and more specifically relates to a method for testing interconnections between integrated circuits in a manner that avoids signal contention.

2. Background Art

The proliferation of modern electronics into our everyday life is due in large part to the existence, functionality and relatively low cost of advanced integrated circuits. As technology moves ahead, the sophistication of electronic systems increases. An important aspect of manufacturing an advanced electronic system is the ability to thoroughly test the components and subassemblies in the system. Many semiconductor manufacturers have provided various built-in self-test circuits on-chip to help to test the functionality of individual integrated circuits located on the chip. The testability of semiconductors was enhanced with the development of boundary-scan testing, as disclosed in IEEE Standard 1149.1 "Standard Test Access Port and Boundary Scan Architecture." Boundary scan testing allows an integrated circuit to be tested by placing shift registers between functional circuitry and input/output pins when the device is placed in test mode. Test data is typically serially scanned into the shift registers to drive certain inputs, clocks are applied, results are captured, and the resultant outputs are determined by shifting the data out of the registers. The serial shift register elements that make up the boundary scan circuitry is known as a scan chain, because test data may be shifted or "scanned" into or out of the daisy-chained boundary scan registers.

In addition to testing the circuitry on a particular integrated circuit, more recent efforts have also recognized the need to test the interconnections between integrated circuits on an electronic assembly. Testing an electronic assembly, such as a printed wiring board or a system that contains multiple printed wiring boards, is difficult using traditional testing techniques. With the increasing popularity of surface mount technology, feature sizes of printed wiring boards have decreased significantly, making it increasingly difficult for automatic test equipment to contact device pins. In addition, multi-chip module technology is gaining widespread acceptance. Many connections within an multi-chip module are not available for contact to an external tester. For these, and many other reasons, testing of electronic assemblies by use of the IEEE 1149.1 boundary scan standard has become very popular. The 1149.1 standard provides a standardized methodology for applying test patterns without the need for a test fixture to contact the functional pins of integrated circuits mounted on the printed wiring board.

Interconnections on an electronic assembly may be tested using boundary scan testing by shifting in appropriate test data into the scan chain, by pulsing one or more clocks to apply the test pattern and capture data, and by shifting the results data out of the boundary scan chain. In a typical electronic assembly, more than one integrated circuit may be able to drive a given net. Lets assume that two integrated circuits may drive the same net. The test vectors will be constructed and checked in a way that assures that no test vector will cause both drivers to drive the nets to opposite states at the same time. However, skew in signal lines and propagation delays may result in short-term contention when making the transition between test patterns. For example, if one integrated circuit drives a net high during one test vector, and a different integrated circuit drives the same net low during the following test vector, it is possible that both drivers will be driving the net for a short time during the transition. This possibility becomes more pronounced when interconnected integrated circuits are on different scan chains that must work together to test the interconnections.

Very short periods of contention would probably not significantly reduce the life of an integrated circuit. Thus, if interconnect testing were performed as a one-time manufacturing test, this contention problem would probably not warrant any great concern. However, more and more systems are performing interconnect testing as part of a built-in self-test procedure each time the system is powered up or reset. Subjecting the integrated circuits to repeated contention may significantly reduce the lifetimes of the integrated circuits. Without a method for avoiding contention during boundary scan testing, the life of the tested integrated circuits will be cut short.

DISCLOSURE OF INVENTION

According to the present invention, methods for testing interconnections on an electronic assembly in accordance with the disclosed embodiments eliminate some or all signal line contention during boundary scan testing. Each of these methods assumes that a first sequence of test patterns for testing the interconnects has been generated. A method in accordance with the first embodiment determines a safe pattern, and inserts the safe pattern between every two patterns in the first sequence of test patterns to generate a second sequence of test patterns. A method in accordance with the second embodiment analyzes the first sequence of test patterns, determines when a transition between two test patterns may cause possible signal contention, and inserts a safe test pattern between the two to generate a second sequence of test patterns. When a transition between two test patterns may potentially cause contention, the transition is said to be unsafe. The safe test pattern in the second embodiment may be a single safe test pattern for all transitions, or may be a safe test pattern that is derived from the two test patterns that generate the unsafe transition. A method in accordance with the third embodiment analyzes the first sequence of test patterns, reorders the test patterns to minimize the number of unsafe transitions, and then inserts a safe test pattern between patterns at unsafe transitions, if any, to assure that no signal contention occurs during boundary scan testing. The safe test pattern for the third embodiment may be a single test pattern, or may be a test pattern that is derived from the test patterns that generate the unsafe transition.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and:

FIG. 13 is a table of a first sequence of test patterns for the circuit of FIG. 12;

FIG. 14 is a table showing the data and driver transitions for the test patterns of FIG. 13.

BEST MODE FOR CARRYING OUT THE INVENTION

Overview

Understanding the present invention requires a basic knowledge of boundary scan testing techniques, discussed below. Those who are familiar with the concepts relating to boundary scan testing may prefer to proceed with the Detailed Description section.

Boundary Scan Testing

Figure 1:
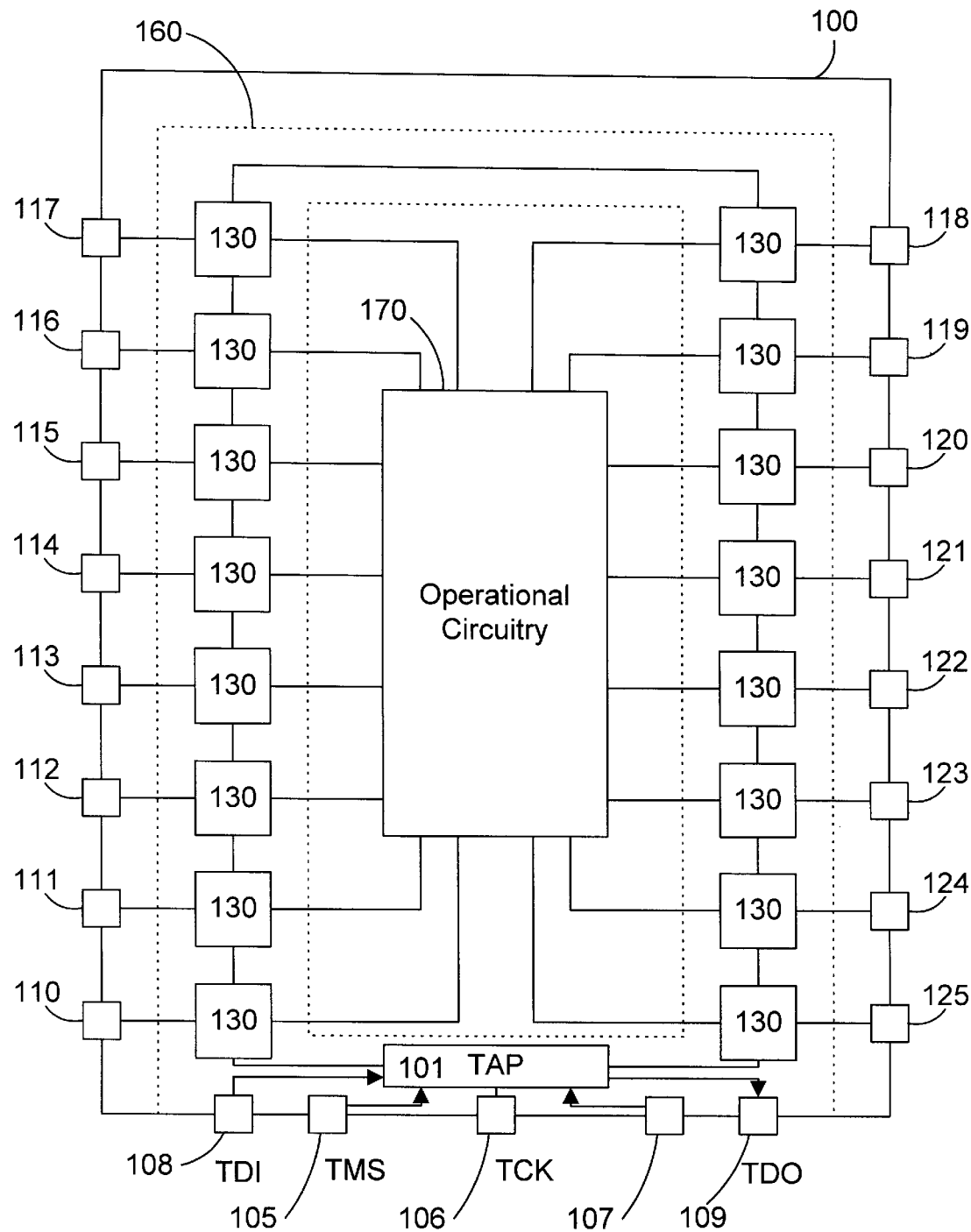
FIG. 1 is a block diagram of an on-chip test configuration that supports interconnect testing.

As discussed in the Background section, boundary-scan testing, as disclosed in IEEE Standard 1149.1, allows an integrated circuit to be tested by placing shift registers between functional circuitry and input/output pins when the device is placed in test mode. Referring to FIG. 1, an integrated circuit 100 that has boundary scan circuitry includes operational circuitry 170, a plurality of input/output pins such as 105–125, a test access port 101, and a plurality of boundary scan cells 130. Operational circuitry 170 is the circuitry that is active during normal operation of device 100. In a normal mode of operation, operational circuitry 170 is coupled to input/output pins 110–125. Only in test or sample mode do boundary scan cells 130 become active.

The serial chain of boundary scan cells 130 is known as a scan chain 160, because test data may be shifted or "scanned" into or out of the daisy-chained boundary scan registers 130. Some input/output pins such as 105–107 provide needed control inputs into the circuitry of scan chain 160, such as shift clock signals to load and empty the scan chain. In the 1149.1 standard, an on-chip controller known as a test access port controller 101 provides the control signals to the boundary scan registers. In test mode, boundary scan cells 130 interrupt the signals to and from operational circuitry 170 that normally pass through to input/output pins 110–125. Boundary scan cells 130 typically include shift registers that allow test data to be shifted into the test data in input (pin 108), and that allow test results to be shifted out on the test data out output (pin 109). Test data is typically serially scanned into the test data in input (pin 108) of scan chain 160 to cause certain boundary scan cells to drive their respective pins. Clocks are then applied, results are captured, and the results are determined by shifting the data out of scan chain 160 at the test data out output (pin 109).

Figure 2:
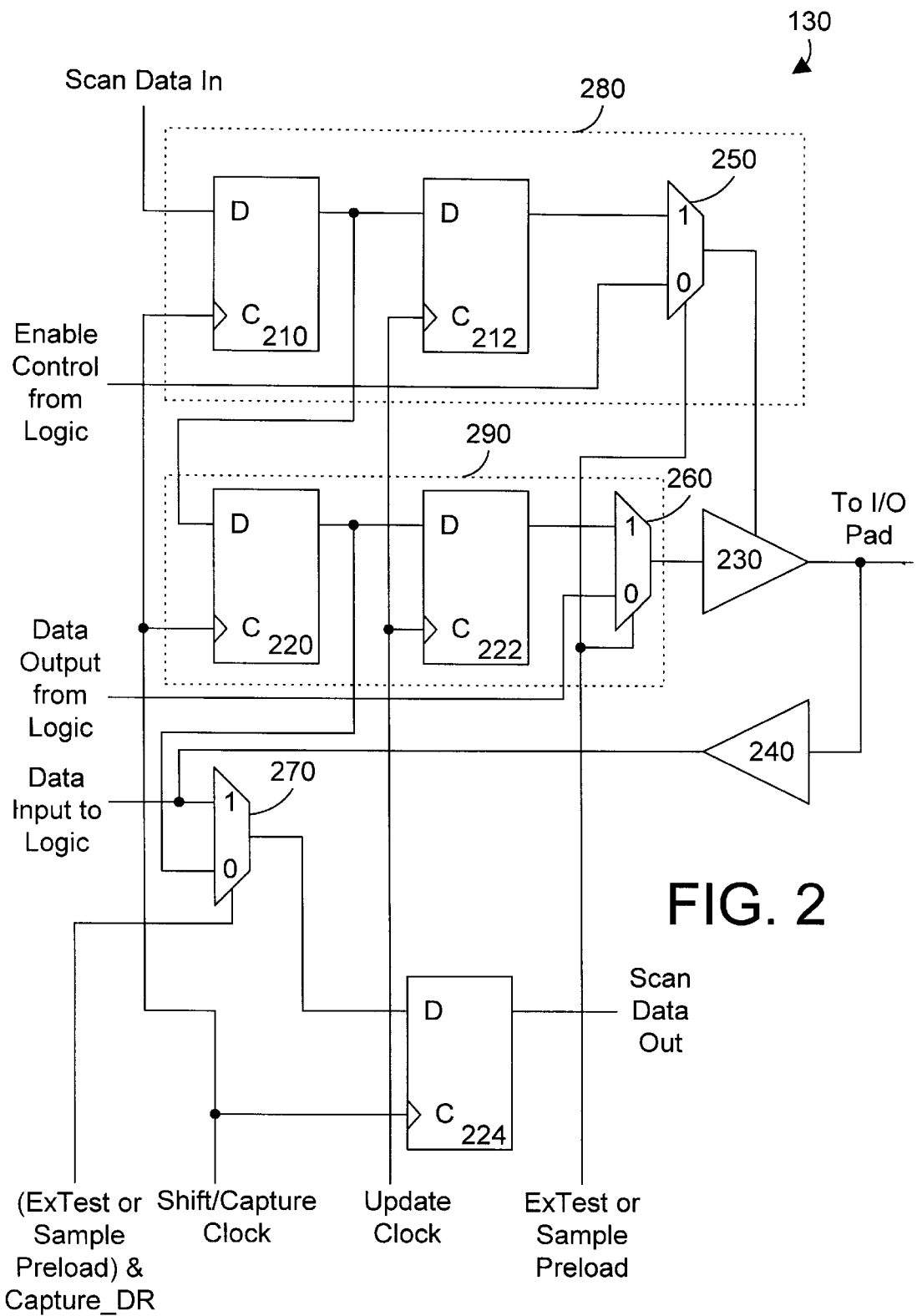
FIG. 2 is a block diagram of one of the boundary scan cells shown in FIG. 1.

Referring to FIG. 2, one configuration for a suitable boundary scan cell 130 includes latches 210, 212, 220, 222 and 224; muxes 250, 260 and 270; output driver 230, and input buffer 240. The concepts of the present invention apply to any boundary scan cell configuration that supports the method steps outlined herein. Latches 210, 212, 220, 222 and 224 contain test data that is shifted into device 100 via a Scan Data In input, which is coupled to the test data in input (pin 108). A clock signal Shift/Capture Clock is provided to shift data present at the scan data in SDI input into latches 210, 220 and 224 and to capture data present on the input/output to latch 224. A second clock signal Update Clock is provided to latch data present on the outputs of latches 210 and 220 into latches 212 and 222. The Shift/Capture Clock and Update Clock are suitably derived from the IEEE 1149.1 standard test clock signal TCK. The operation of cell 130 is well-known in the art, and is not discussed in further detail herein. Note that many other types of boundary scan cells may be used in accordance with the method of the present invention.

Boundary Scan Testing of Interconnects

Figure 3:
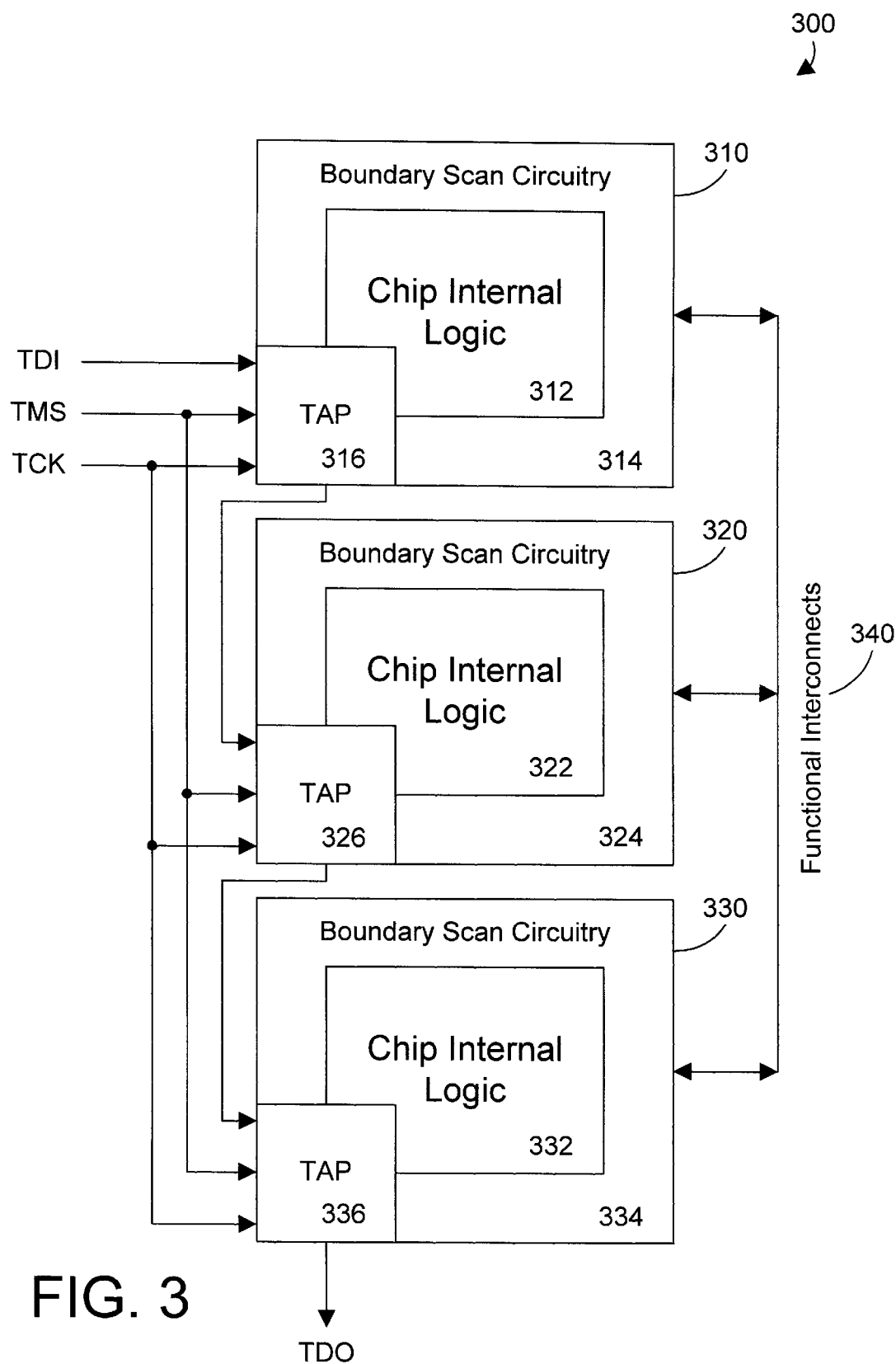
FIG. 3 is a block diagram showing how the test access ports of three integrated circuits may be daisy chained together to form a boundary scan chain.

The boundary scan methodology of testing interconnections in an electronic assembly has gained great importance in recent years. Referring to FIG. 3, a sample electronic assembly 300 includes integrated circuits 310, 320 and 330. Integrated circuit 310 includes internal logic 312 and a boundary scan circuit 314 that includes a test access port 316. In similar fashion, integrated circuits 320 and 330 include corresponding internal logic 322 and 332, boundary scan circuits 324 and 334, and test access ports 326 and 336. Each integrated circuit 310, 320 and 330 are interconnected via functional interconnects 340. The goal of interconnect testing via boundary scan techniques is to assure that all functional interconnections 340 between integrated circuits are correct.

A scan chain is formed by daisy-chaining the test access ports 316, 326 and 336 as shown. The test mode select TMS and test clock TCK signals are routed to each test access port. The input of the scan chain is test data in, which is tied to the test data input of test access port 316. The test data output of test access port 316 is connected to the test data input of test access port 326. In similar fashion, the test data output of test access port 326 is connected to the test data input of test access port 336. The test data output of test access port 336 is the test data output of the scan chain. Functional interconnects 340 may be appropriately tested by sequentially loading a number of test patterns into the scan chain formed by integrated circuits 310, 320 and 330, applying the test pattern, capturing the results, and reading out from the scan chain the results of each test pattern.

Note that testing assembly 300 requires a knowledge of the interconnect structure between integrated circuits 310, 320 and 330. This information is derived from design information describing the system under test. This design information must include descriptions of the integrated circuit's boundary scan structure, such as a representation in Boundary Scan Description Language, and logical descriptions of the interconnect topology of all interconnect structures within the system under test, including multi-chip modules, printed wiring boards, backplanes, connectors, cables, etc. This information must be condensed into a form that can be used to generate interconnect test patterns. The methods in accordance with the preferred embodiments disclosed herein assume that a first sequence of test patterns has been generated using known techniques that will test the interconnect structure of an assembly such as assembly 300.

Contention During Boundary Scan Testing

Test patterns are generated in a manner that assures that there is never any steady-state signal contention. However, as described in the Background of the Invention, it is possible for contention to occur during boundary scan testing when the scan chain is making a transition from one test pattern to the next. Driver contention occurs when at least two driver elements on a particular net attempt to drive the net to opposite logic values. This situation opens up a low resistance path from power to ground that can cause drivers to overload and burn out. For example, if a particular net is being driven high by a first driver during one test pattern, and the following test pattern drives the same net low by a different driver, it is possible due to clock skew and differences in propagation delay that both drivers could attempt for a short period of time to simultaneously drive the net to opposite states. When both drivers are on the same scan chain, this contention is relatively short. However, even short periods of contention can shorted the life of an integrated circuit if the contention occurs on a regular basis, as would happen if the interconnect structure is tested using boundary scan testing each time the assembly is powered up.

Figure 4:
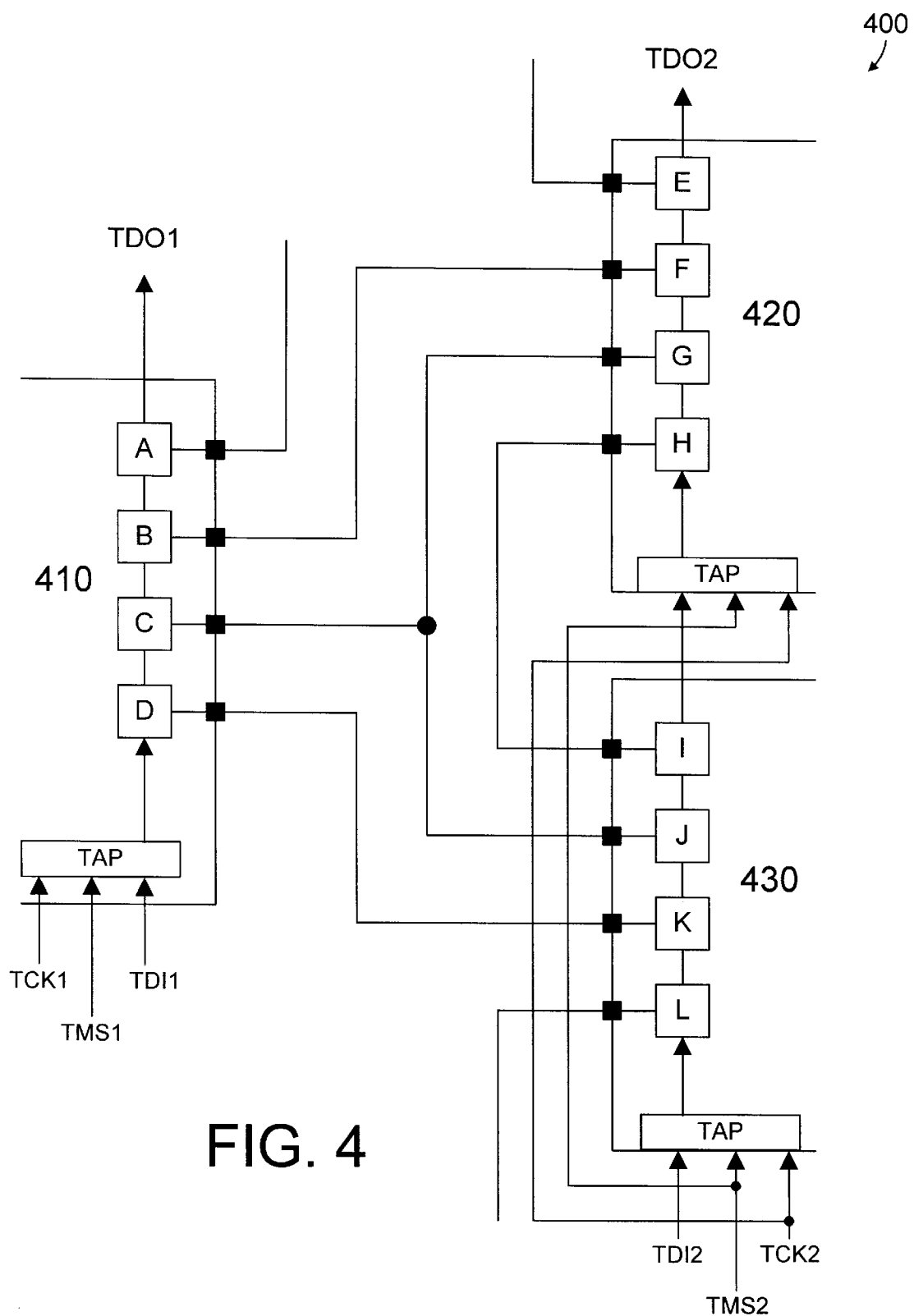
FIG. 4 is a schematic view of an example electronic assembly that contains three integrated circuits and two different boundary scan chains.

In a system that has more than one scan chain, it is possible to have contention for longer periods of time. Referring to FIG. 4, in an assembly 400 that includes integrated circuits 410, 420 and 430, integrated circuit 410 is on a first scan chain with input test data in 1 TDI1 and output test data out 1 TDO1, while integrated circuits 420 and 430 are on a different scan chain with input test data in 2 TDI2 and output test data out 2 TDO2. Lets assume that in one test pattern, cell C in integrated circuit 410 is driving its net high while cells G and J are in the tristate or receive state. Lets also assume that in the following test pattern, cell G in integrated circuit 420 drives the same net low, while cells C and J are in the non-driving mode. If the second scan chain changes to the second test pattern before the first scan chain changes, contention will result. This contention may be more severe, and depends on the timing skew between scan chains. One solution would be to use costly hardware to synchronize the two scan chains. However, even this solution does not fix the small periods of contention that may result even if the scan chains are perfectly synchronized or on the same scan chain. In the best mode of the invention, the methods of the preferred embodiments are used to eliminate all contention in a system, thereby assuring that no contention of any kind will exist in the system. However, it is equally within the scope of the invention to eliminate less than all potential contentions in a boundary scan test.

Detailed Description

The methods in accordance with the present invention presented herein assume that a first sequence of test patterns has been generated to test the interconnect structure of an electronic assembly. The methods of the preferred embodiments operate on a first sequence of test patterns to produce a second sequence of test patterns that eliminate some or all of the transitions between test patterns that could potentially create contention during boundary scan testing. For the discussion herein, a transition between test patterns is considered safe if the transition cannot cause contention. A transition between test patterns that may cause contention is unsafe.

Figure 5:
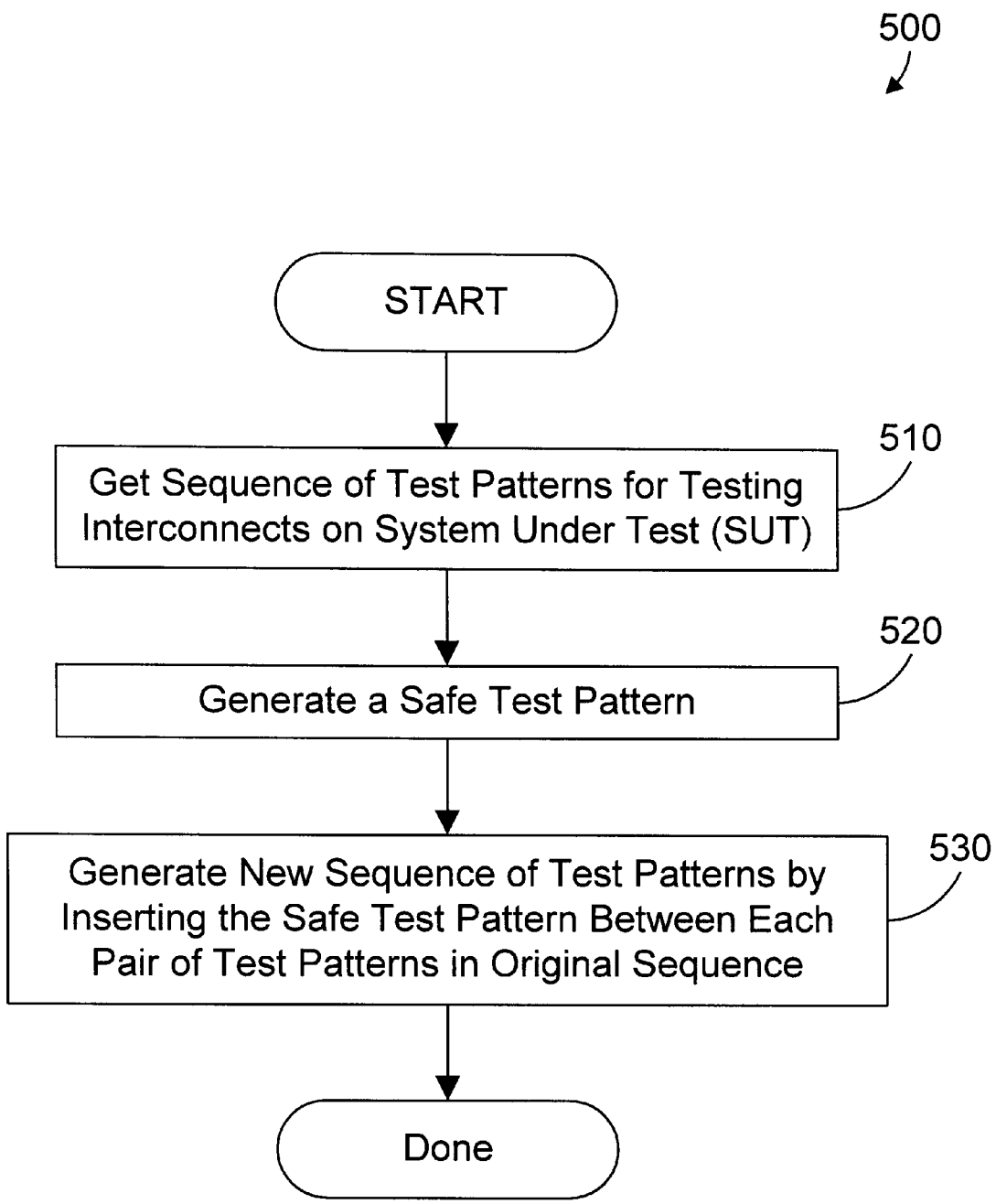
FIG. 5 is a flow diagram of a method in accordance with a first embodiment of the present invention for assuring that no contention will occur during boundary scan testing.

Referring to FIG. 5, a method 500 in accordance with a first embodiment of the invention takes an original sequence of test pattern and inserts a safe test pattern between every two test patterns in the original sequence to generate a new sequence of test patterns that avoids all contention during boundary scan testing. Method 500 starts by getting the sequence of test patterns that have been generated for testing the interconnects on the system under test (step 510). Next, method 500 generates a safe test pattern (step 520). The safe test pattern can be derived from the Boundary Scan Description Language or any other representation that describes the boundary scan structure for a given integrated circuit. The safe test pattern places all drivers in a non-driving high impedance state. Finally, method 500 generates a new sequence of test patterns by inserting the safe test pattern between each pair of test patterns in the original sequence of test patterns (step 530). This creates a sequence of test patterns where each test pattern transition is either to or from a safe pattern thus eliminating the possibility of contention on transitions between patterns. Method 500 succeeds at eliminating all contention during boundary scan testing by driving each net to a high impedance state before driving it to the next state. If there are N test patterns in the original sequence, N–1 safe patterns are required, resulting in 2N–1 total test patterns. This method easily avoids contention without requiring any analysis of existing test patterns.

While method 500 in accordance with the first embodiment succeeds in generating a sequence of test patterns that avoid contention during boundary scan testing, it does so by inserting a relatively large number of safe patterns. Furthermore, some logic families may not permit the application of a safe pattern that causes all nets to be undriven or placed in a high impedance state. For these reasons, a more refined approach to avoiding contention during boundary scan testing is needed.

Figure 6:
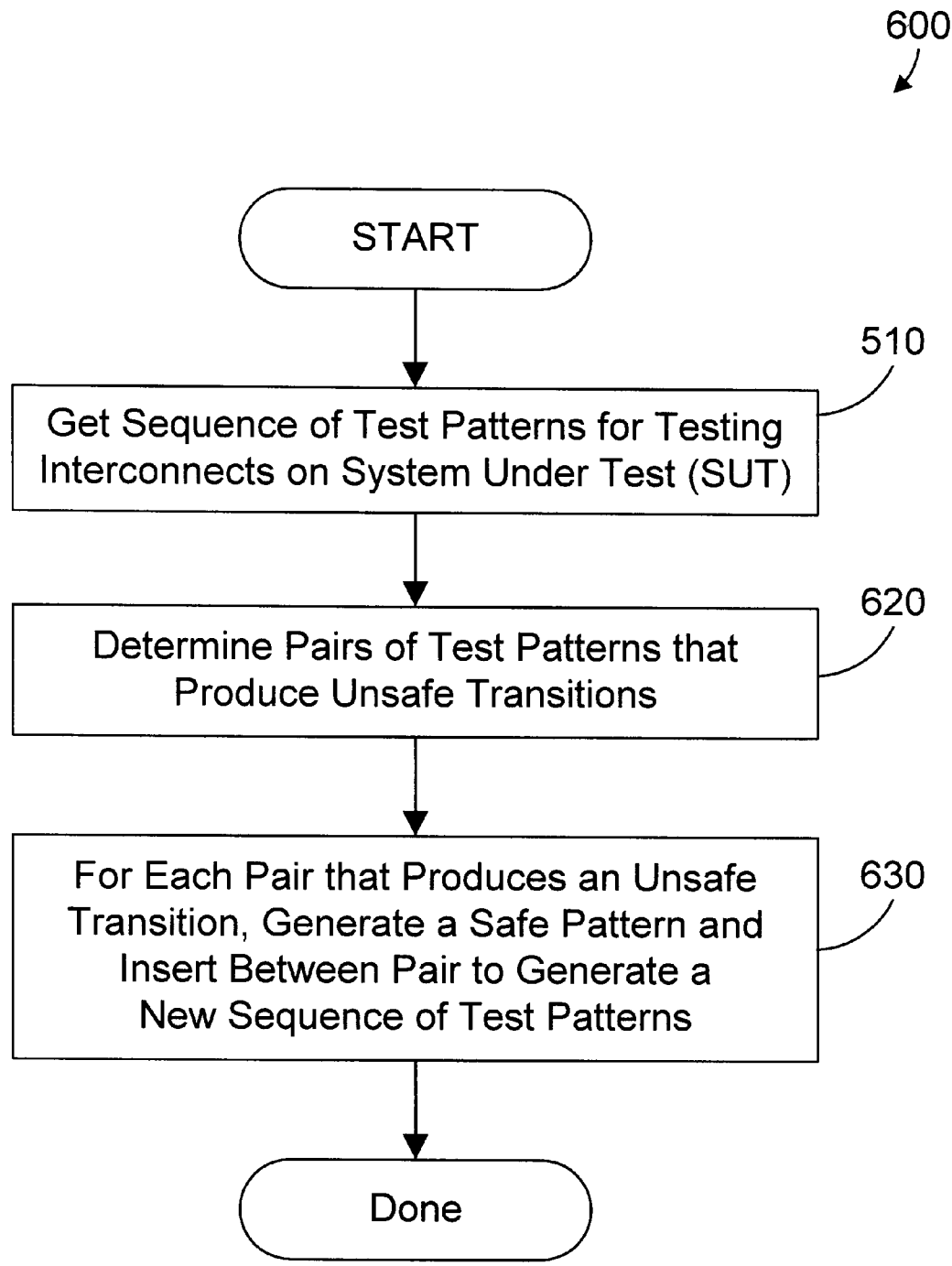
FIG. 6 is a flow diagram of a method in accordance with a second embodiment of the present invention for assuring that no contention will occur during boundary scan testing.

With the information describing the boundary scan structure of the chips in the system under test and a description of the system interconnect structure, it is possible to analyze a sequence of interconnect test patterns to determine if the pattern transitions in the sequence could cause contention. Referring to FIG. 6, a method 600 in accordance with the second embodiment starts by getting the first sequence of test patterns for the system under test (step 510). Next, method 600 analyzes the test patterns and identifies pairs of test patterns that result in unsafe transitions, i.e., transitions that may potentially cause contention (step 620). This analysis results in identifying the problem areas in the sequence of test patterns rather than assuming, as does method 500 of the first embodiment, that all transitions may cause contention. In reality, the transition between two test patterns A and B is safe if any one of the following conditions are true for each net$_{(N)}$ in the system under test:

1) the driver (or set of drivers) driving net N in pattern A is the same as the driver (or set of drivers) driving net N in pattern B
2) the value driven on net N in pattern A is identical to the value driven on net N in pattern B
3) pattern A or pattern B cause N to be undriven The only time the transition is unsafe is if different drivers are driving the same net to opposite values in test patterns A and B. For each pair of test patterns that produces an unsafe transition, method 600 generates a safe pattern and inserts the safe pattern between the pair (step 630) to generate a new sequence of test patterns that avoids contention during boundary scan testing.

Figure 7:
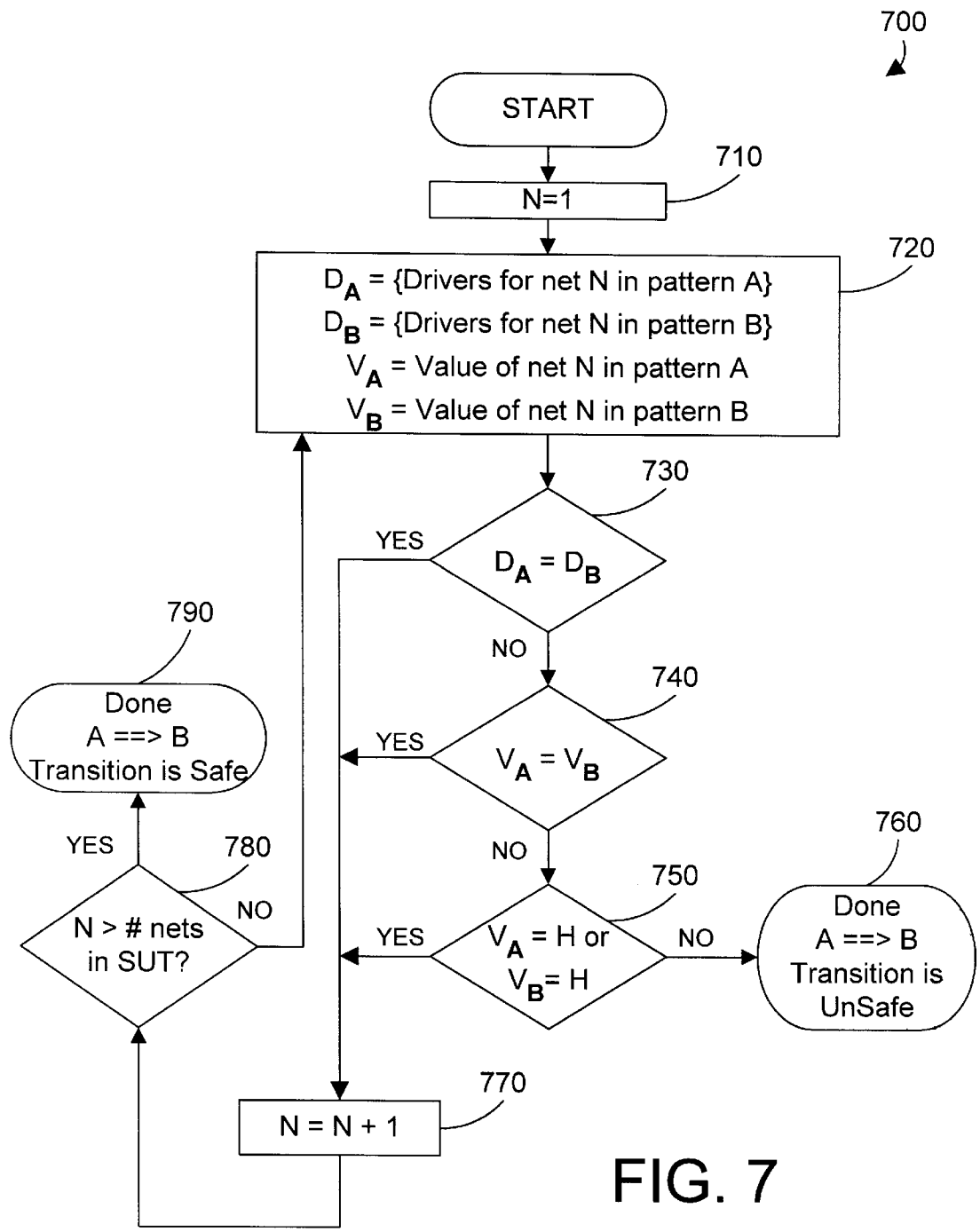
FIG. 7 is a flow diagram of a method for determining whether a transition from one pattern A to another pattern B is safe.

Referring to FIG. 7, a method 700 is one suitable implementation of a portion of step 620 of FIG. 6. Method 700 determines whether or not the transition between two test patterns A and B is safe by analyzing one pair of test patterns A and B net by net. First, a counter N that corresponds to the net number being analyzed is set to 1 (step 710), which means that the first net in the test pattern is analyzed first. $D_A$ represents the set of all active (on) drivers for net N in pattern A. $D_B$ represents the set of active (on) drivers for net N in pattern B. $V_A$ is the logic value of net N in pattern A, while $V_B$ is the logic value of net N in pattern B. These definitions are in step 720. Next, the set of active drivers for net N in pattern A ($D_A$) is compared against the set of active drivers for net N in pattern B ($D_B$) (step 730). If the same drivers are driving the net in both test patterns (step 730=YES), no contention can occur, so N is incremented (step 770). The number N is then compared against the total number of nets to be analyzed (step 780), and if all nets in test patterns A and B have been analyzed (step 780=YES), the transition from A to B is declared safe (step 790). If there remain in test patterns A and B nets that have not yet been analyzed (step 780=NO), the process is repeated for the next net.

If the set of drivers for net N in pattern A ($D_A$) are different than the set of drivers for net N in pattern B ($D_B$) (step 730=NO), next the values of the net are compared (step 740). If the values are the same (step 740=YES), this means that the different drivers are driving the net to the same logic level, so no contention can occur. If, however, the drivers are different (step 730=NO) and the values are different (step 740=NO), we next check to see if either pattern A or pattern B place net N in a high impedance state (step 750). If either of these test patterns put net N in a high impedance state (step 750=YES), the transition is either from or to a high impedance state, which cannot cause contention. Only if the set of drivers is different (step 730=NO), the values are different (step 740=NO), and neither test pattern drives net N to a high impedance state (step 750) is the transition from A to B declared to be unsafe (step 760). Note that the transition from A to B is declared to be unsafe as soon as the first unsafe transition in the test patterns is encountered, without regard to how many nets may have safe or unsafe transitions. Note that method 700 of FIG. 7 would have to be repeated for every test pattern transition in the original sequence of test patterns in step 510 of FIG. 6. Method 700 of FIG. 7 thus provides a way to check two test patterns for safe transitions during boundary scan testing.

Figure 8:
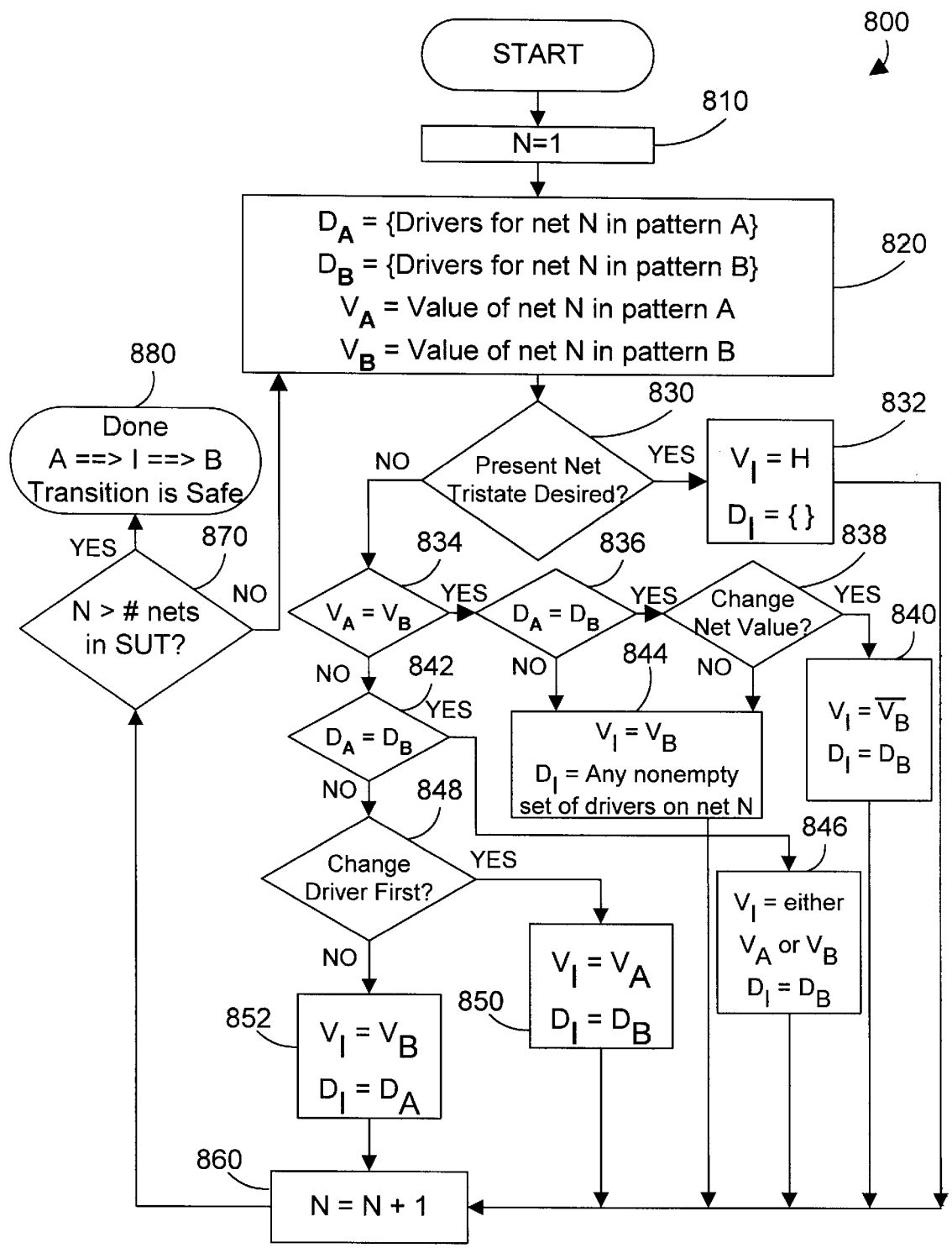
FIG. 8 is a flow diagram of a method for generating a safe pattern I between two test patterns A and B.

Referring to FIG. 8, a method 800 is one suitable implementation of a portion of step 630 of FIG. 6. Method 800 is used to generate a safe pattern I between two test patterns A and B when it has been determined that the transition from A to B is an unsafe transition. Method 700 of FIG. 7 is one way to determine if the transition from A to B is unsafe. First, counter N is set to 1 (step 810). Next, the same definitions in step 720 are applied in step 820. Next, we determine whether or not placing the net in a high impedance state is desired (step 830). This decision may be based on the characteristics of the logic family being tested, because some logic families prefer to not have any of their nets in a high impedance state. If the logic family allows the net to be in a high impedance state (step 830=YES), the value for safe pattern I at that net N is set to a high impedance state and the set of drivers for I at that net N is empty (step 832). The net number N is incremented (step 860), checked against the total number of nets to be analyzed (step 870), and if all nets have been analyzed (step 870=YES), method 800 is done (step 880), and the generated safe pattern I is inserted between test patterns A and B. If all nets have not yet been analyzed (step 870=NO), the analysis proceeds for the next net. Note that when step 832 is followed for each net in the system under test, the generic safe test pattern of step 520 of method 500 (FIG. 5) is generated.

If the logic family does not allow the net to be in a high impedance state (step 830=NO), method 800 then dynamically determines a safe transition between A and B for net N depending on the set of drivers driving net N, the values on net N, and whether we want the value or driver to change during the intermediate pattern I. If the values in pattern A and pattern B for net N are the same (step 834=YES) and the set of drivers for pattern A and pattern B for net N are the same (step 836=YES), there is no contention. At this point, if for some reason it is desired to change the net value during the intermediate pattern (step 838=YES), $V_I$ is set equal to the complement of $V_B$, and $D_I$ is set to $D_B$ (step 840). If the net value is to remain the same, $V_I$ is set equal to $V_B$, and $D_I$ is set to any nonempty set of drivers on net N (step 844). Because the values are the same, the set of drivers driving the net doesn't matter, so long as there is at least one driver driving net N. If the values are the same (step 834=YES) but the drivers are different (step 836=NO), there can still be no contention, so $V_I$ is set equal to $V_B$, and $D_I$ is set to any nonempty set of drivers on net N (step 844).

If the values are different (step 834=NO) and the sets of drivers are the same (step 842=YES), $V_I$ is set equal to either $V_A$ or $V_B$, and $D_I$ is set to $D_B$ (step 846). If the drivers are the same, there can be no contention, so the value assigned to $V_I$ doesn't matter so long as the set of drivers $D_I$ for net N remains the same.

The potential contention occurs when the present net cannot be tristated (step 830=NO), the values are different (step 834=NO) and the set of drivers driving net N are different (step 842=NO). At this point we make an arbitrary decision of whether to change the driver first or whether to change the data first (step 848). If the driver is to be changed first (step 848=YES), $V_I$ is set equal to $V_A$, which keeps the data the same from test pattern A to test pattern I, and $D_I$ is set to $D_B$, which changes the set of drivers for intermediate test pattern I to match test pattern B (step 850). If the value is to be changed first (step 848=NO), $V_I$ is set equal to $V_B$, which changes the data from test pattern A to test pattern I, and $D_I$ is set to $D_A$, which keeps the set of drivers the same for test pattern A and intermediate test pattern I (step 852). Intermediate test pattern I is constructed net by net by looping through method 800.

Note that method 800 has been represented very broadly to cover a wide range of implementation possibilities. In practical terms, some of the decisions probably don't need to be made. For example, if the values and set of drivers are the same for a particular net N, as would happen when steps 834 and 836=YES, $V_I$ could be set to $V_A$, and $D_I$ could be set to $D_A$, rather than determining if the net value should change in step 838. Similarly, if the values are different (step 834=NO) and the set of drivers is different (step 842=NO), the decision of whether to change the driver first or the value first (step 848) probably need not be made. Either the value may be changed first, or the drivers may be changed first. Either way avoids contention, and only one need actually be implemented in generating intermediate test pattern I. Method 800 allows the generation of a safe test pattern I between test patterns A and B for a variety of different conditions, some of which may not apply depending on the particular application. Any possible safe pattern between test pattern A and B will be generated by some variation of method 800. Note that in step 630 of FIG. 6, method 800 will be repeated for each pair of test patterns that have an unsafe transition, and each resulting safe test pattern I will be inserted between the two test patterns that previously caused an unsafe transition. While the first embodiment creates a single safe pattern that puts all nets in a high impedance state, the second embodiment custom-crafts a multitude of safe patterns that depend on the patterns that were generating an unsafe transition. The second embodiment thus improves on the first embodiment by analyzing the original test patterns for unsafe transitions, and by intelligently inserting only the number of safe test patterns needed to fix the unsafe transitions.

Figure 9:
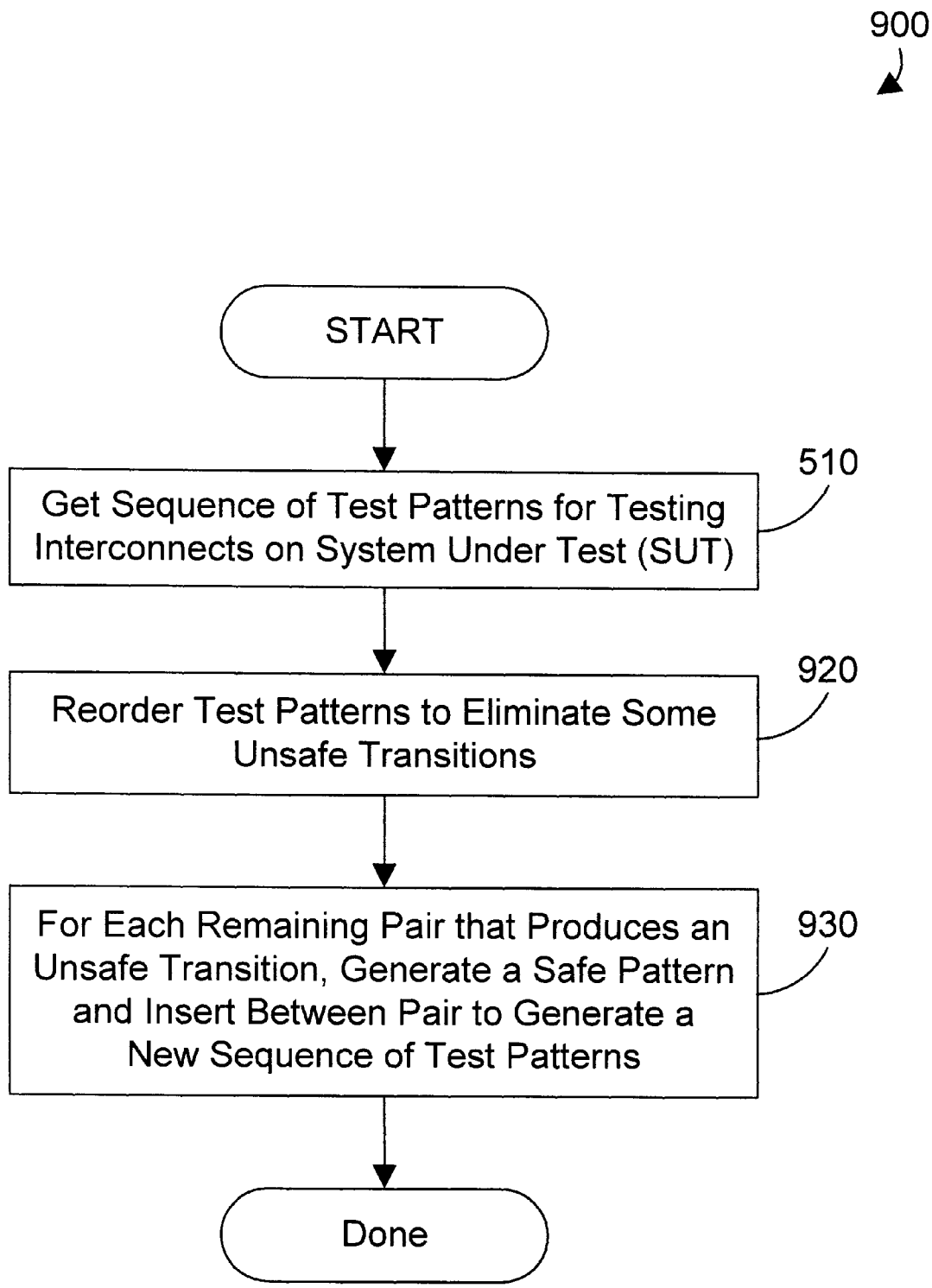
FIG. 9 is a flow diagram of a method in accordance with a third embodiment of the present invention for assuring that no contention will occur during boundary scan testing.

Referring now to FIG. 9, a method 900 in accordance with a third embodiment of the invention further improves on the second embodiment by performing reordering of the test patterns to eliminate some unsafe transitions, rather than just generating and inserting a safe test pattern everywhere that an unsafe transition occurs. Method 900 begins by getting the first sequence of test patterns (step 510). These test patterns are then reordered to eliminate one or more unsafe transitions (step 920). Any remaining unsafe transitions are then fixed by producing a safe test pattern for each unsafe transition (step 930).

Figure 10:
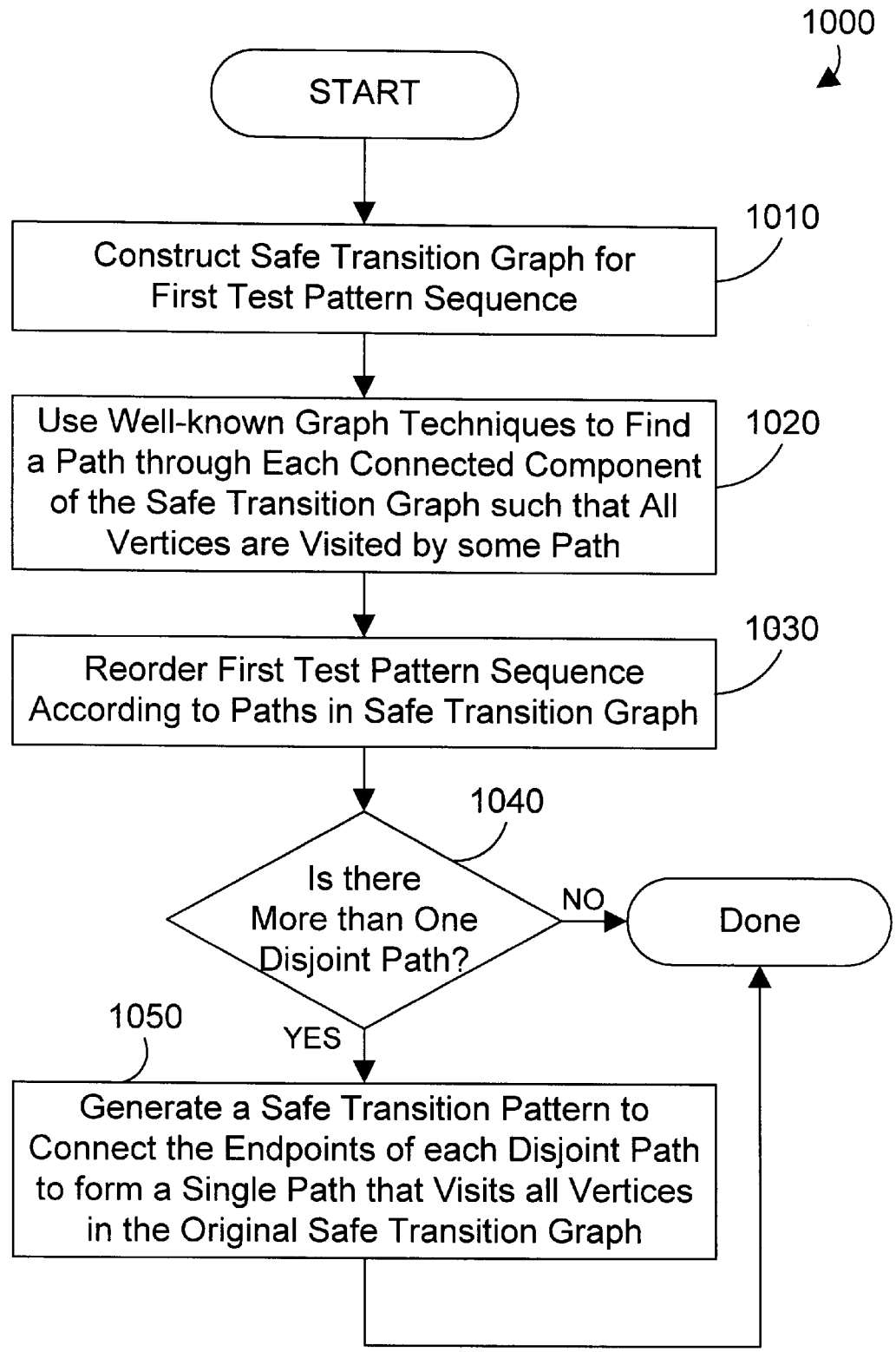
FIG. 10 is a flow diagram of a method for reordering test patterns in accordance with the third embodiment.

Referring to FIG. 10, a method 1000 is a suitable method for reordering test patterns and generating safe test patterns for steps 920 and 930 of FIG. 9. Method 1000 begins by constructing a safe transition graph for a given test pattern sequence (step 1010). The details of how the safe transition graph is constructed are discussed below with reference to FIG. 11. For the discussion here, suffice it to say that the safe transition graph is a graph that has each test pattern represented by a vertex and safe transitions represented by connections between vertices. Any path through the safe transition graph that visits all the vertices represents an ordering of the test patterns that is contention-free. It is possible for the safe transition graph to be composed of two or more disconnected pieces. In this case, a single path cannot visit all the vertices and some extra safe transition patterns generated by method 800 must be added. Once the safe transition graph is constructed, well-known graph techniques are used to find a path through each connected component of the safe transition graph such that all vertices are visited by some path (step 1020). The safe transition graph allows standard, well-understood graph theory and algorithms to be applied to the problem of finding a sequence of test patterns which can be applied without danger of contention. Any standard graph algorithm such as depth first search may be used to find a path through each connected component of the safe transition graph. Some general references regarding graph theory include: Reingold et al., "Combinatorial Algorithms Theory and Practice" (Prentice-Hall, 1977); Deo, "Graph Theory with Applications to Engineering and Computer Science", (Prentice-Hall 1974); Harary, "Graph Theory" (Addison-Wesley, 1969); and Berge, "The Theory of Graphs and Its Applications" (Wiley, 1962).

If the safe transition graph has all vertices in a single connected piece, it is fully connected, and a single path may be found that visits all vertices at least once. This path defines an order of test patterns that will eliminate all possibility of contention during boundary scan testing. Once paths have been determined, the test patterns are reordered according to the path through the safe transition graph (step 1030). If the safe transition graph has one disjoint path (step 1040=NO), the reordering has fixed all potential contention in the test patterns. For example, if the safe transition graph is Hamiltonian and a Hamiltonian path can be found, the reordering of the test patterns finds an optimal safe sequence without adding any safe test patterns. If the safe transition graph is fully connected, a safe sequence can be found, but some test patterns might need to be applied more than once. However, if there is more than one disjoint path in the safe transition graph (step 1040=YES), one or more safe patterns must be generated (step 1050) and inserted into the safe transition graph to connect the paths found in step 1020 into a single path. At this point, the resulting sequence of test patterns will not cause any contention during boundary scan testing.

Figure 11:
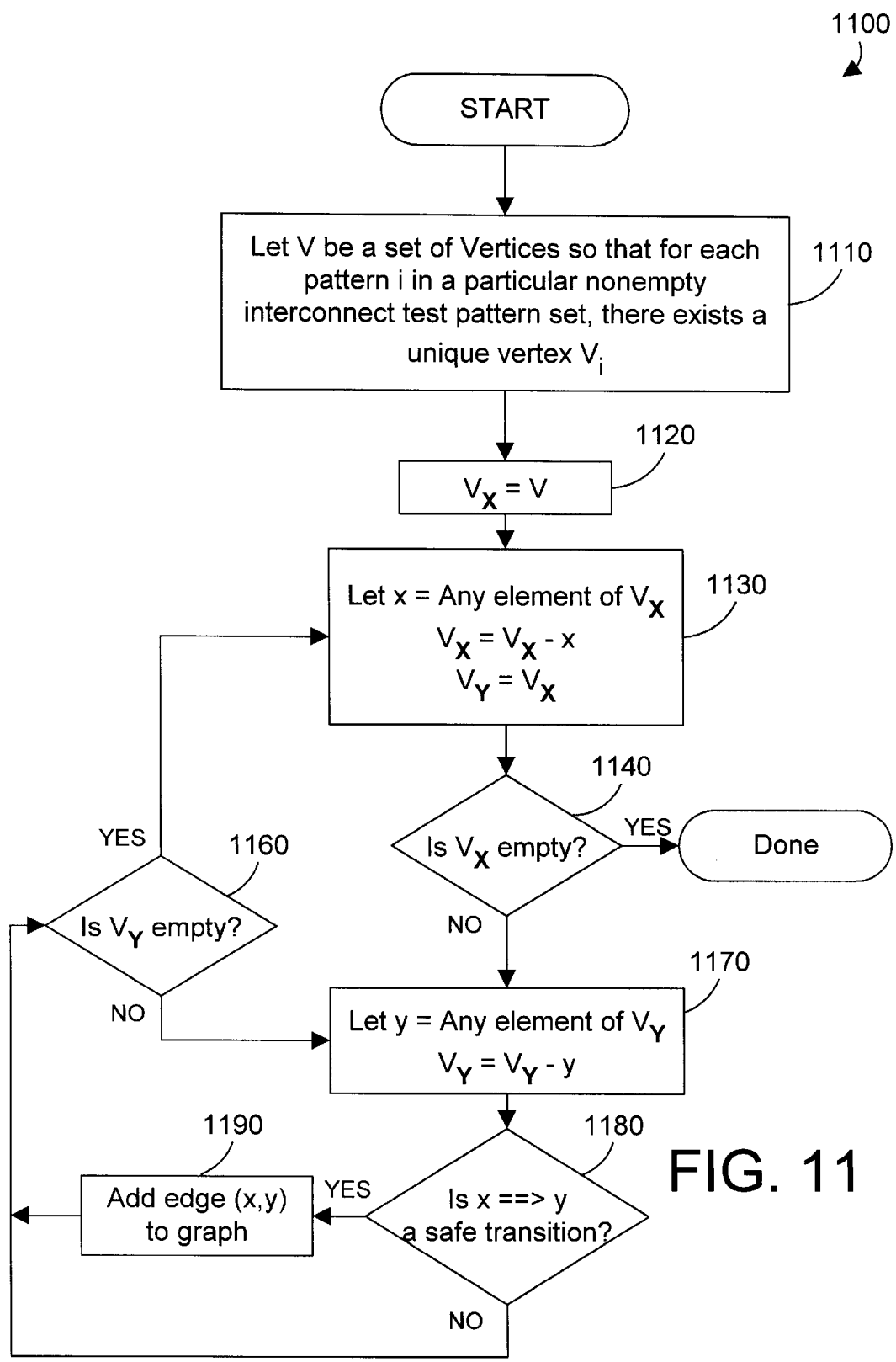
FIG. 11 is a flow diagram of a method for constructing a safe transition graph in accordance with the third embodiment.

Referring to FIG. 11, a method 1100 is one suitable method for generating a safe transition graph (step 1010 in FIG. 10). This method defines a first set of vertices V, and second and third sets of vertices $V_X$ and $V_Y$. V is defined to be a set of vertices so that for each pattern i in a particular nonempty interconnect test pattern sequence, there exists a unique vertex Vi (step 1110). $V_X$ is then assigned all the vertices in set V (step 1120). An element x is then selected and removed from set $V_X$ and a new set $V_Y$ is set to this new $V_X$ (step 1130). If $V_X$ is empty (step 1140=YES), method 1100 is done. If $V_X$ is not empty (step 1140=NO), an element y is then selected and removed from set $V_Y$ (step 1170). Next, method 1100 determines whether the transition from x to y is safe or not (step 1180). Step 1180 may be suitably performed using method 700 of FIG. 7. If the transition from x to y is safe (step 1180=YES), an edge is added between x and y in the safe transition graph (step 1190). If the transition is not safe, no edge is added, and the next element of $V_Y$ is considered. If $V_Y$ is empty (step 1160=YES), method 1100 loops back to step 1130 to operate on a new element in $V_X$. If $V_Y$ is not empty (step 1160=NO), the next element of $V_Y$ is selected (step 1170), and the transition from x to y is analyzed to determine whether or not it's safe (step 1180). Method 1100 thus selects one test pattern, and determines whether the transition between it and every other test pattern is safe or not, and if so, it inserts an edge into the safe transition graph. This process repeats until all possible combinations of transitions between test patterns have been analyzed. The result is a graph of vertices corresponding to test patterns interconnected with all possible safe transitions between them. Thus, as described above, if a path in the safe transition graph can be found that visits all the vertices, a simple reordering according to the path will succeed in avoiding all contention during boundary scan testing. If some vertices cannot be visited along a path, the addition of some safe patterns create new paths that eventually reach all vertices. The third embodiment thus eliminates unsafe transitions by reordering, then generates safe test patterns where needed to assure a new sequence of test patterns that cannot cause contention during boundary scan testing.

Figure 12:
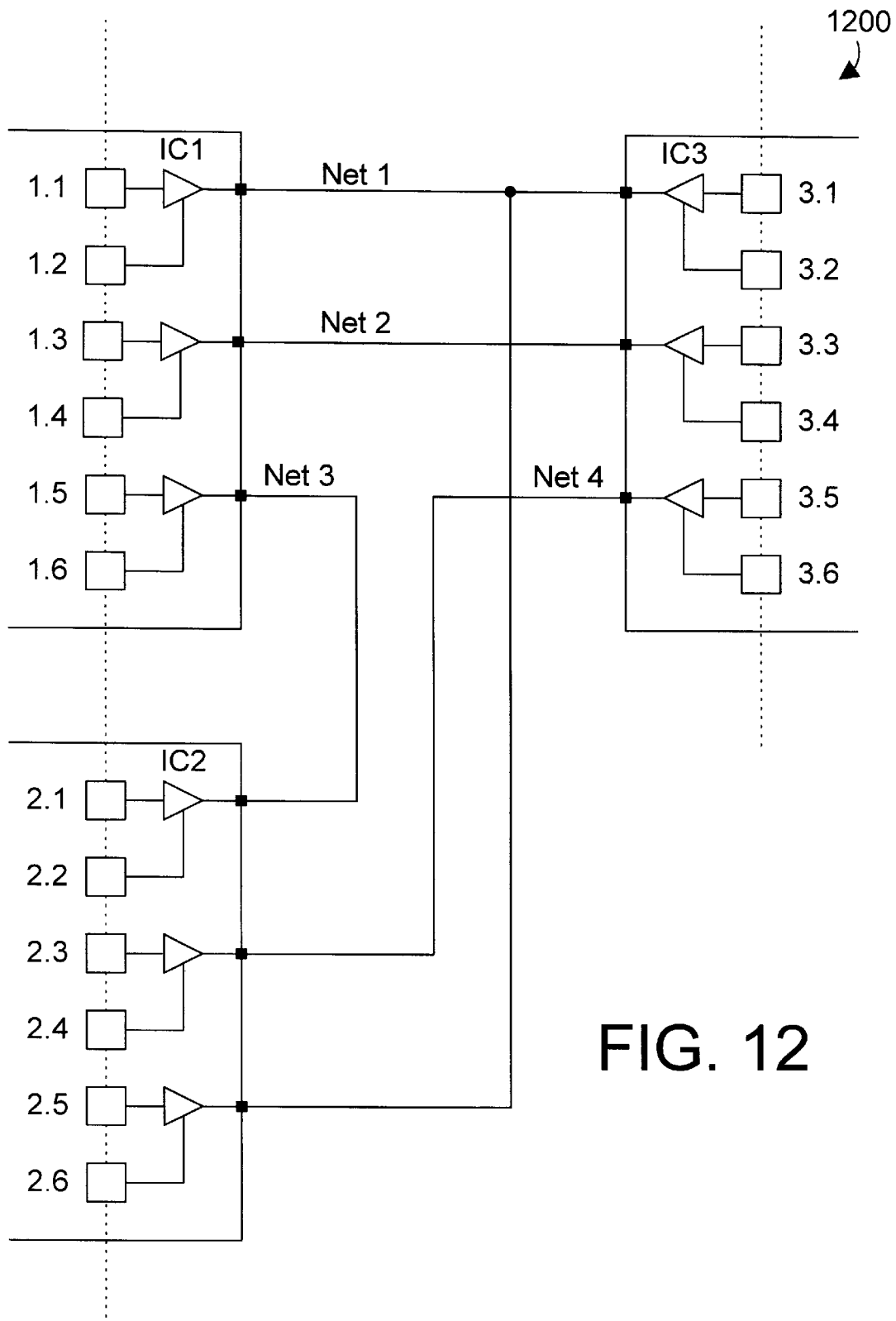
FIG. 12 is a schematic diagram of an example electronic assembly that has three interconnected integrated circuits.

The third embodiment may best be understood by examining an example circuit assembly 1200 shown in FIG. 12. Assembly 1200 includes three integrated circuits IC1, IC2 and IC3, interconnected with four nets: net 1, net 2, net 3 and net 4. IC1 includes boundary scan cells 1.1–1.6; IC2 includes boundary scan cells 2.1–2.6; and IC3 includes boundary scan cells 3.1–3.6. All of the boundary scan cells within an integrated circuit are connected in a scan chain, and each integrated circuit may have its own boundary scan control or may daisy chain from the other integrated circuits. Note that the odd numbered cells, such as 1.1, 1.3, etc., correspond to portion 290 of boundary scan cell 130 of FIG. 2, while the even numbered cells, such as 1.2, 1.4, etc., correspond to portion 280 of boundary scan cell 130.

For this particular example, we assume that all three integrated circuits IC1, IC2 and IC3 are all in the same scan chain. For IC1, cell 1.1 may drive net 1, cell 1.3 may drive net 2, and cell 1.5 may drive net 3, while cell 1.2 enables the driver for cell 1.1 on net 1, cell 1.4 enables the driver for cell 1.3 on net 2, and cell 1.6 enables the driver for cell 1.5 on net 3. For IC2, cell 2.1 may drive net 3, cell 2.3 may drive net 4, and cell 2.5 may drive net 1, while cell 2.2 enables the driver for cell 2.1 on net 3, cell 2.4 enables the driver for cell 2.3 on net 4, and cell 2.6 enables the driver for cell 2.5 on net 1. For IC3, cell 3.1 may drive net 1, cell 3.3 may drive net 2, and cell 3.5 may drive net 4, while cell 3.2 enables the driver for cell 3.1 on net 1, cell 3.4 enables the driver for cell 3.3 on net 2, and cell 3.6 enables the driver for cell 3.5 on net 4.

FIG. 13 is a table 1300 of test patterns designed to test continuity in the interconnect structure of assembly 1200, where 1 represents a high logic state, 0 represents a low logic state, and d represents a don't care, meaning that the signal can be either high or low. Seven test patterns Test1–Test7 may be sequentially applied during boundary scan testing. Test7 is the safe pattern for the sample assembly 1200 of FIG. 12, and is not a necessary test pattern. Table 1300 represents the first sequence of test patterns for testing interconnections during boundary scan testing that is generated in some previous step using known techniques.

The test patterns of table 1300 may be analyzed along with the interconnect structure of assembly 1200 to determine a net value and set of drivers for that net for each test pattern Test1–Test7. A table 1400 of FIG. 14 contains the results of this analysis. The entries to table 1400 may be used as inputs to methods 700 and 800. Performing method 700 for each transition in this sequence reveals that the transition from Test2 to Test3 is not safe, and the transition from Test4 to Test5 is not safe. These unsafe transitions are marked with bold lines in table 1400 of FIG. 14. Thus, the test patterns of table 1300 in their current order would potentially cause contention during boundary scan testing.

Figure 15:
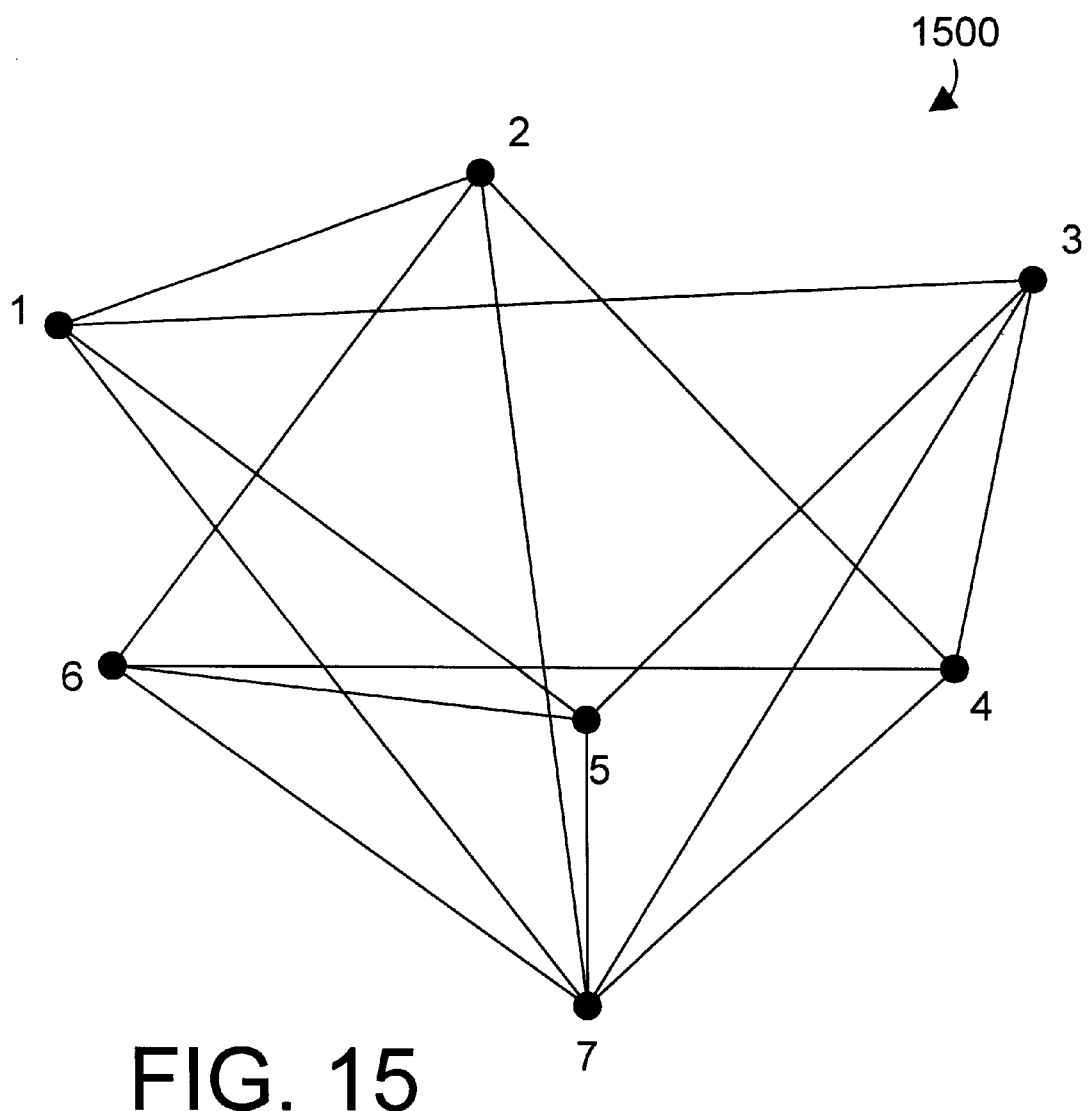
FIG. 15 is a safe transition graph for the circuit and test patterns of FIGS. 12–14.

Method 900 (FIG. 9) in accordance with the third embodiment begins with the sequence of test patterns in table 1300 (FIG. 13) (step 510). Next, the test patterns are reordered (step 920) and safe patterns are generated, if needed (step 930). Steps 920 and 930 are suitably performed using method 1000. The first step in method 1000 is to construct a safe transition graph (step 1010). This step corresponds to method 1100 in FIG. 11. Each test pattern is compared against every other test pattern using method 1100 to determine whether each transition is safe or not. Step 1180 that determines whether or not a particular transition is safe preferably uses method 700 of FIG. 7 to make that determination. If the transition between two test patterns is safe, an edge is added to the safe transition graph between the vertices corresponding to those test patterns. For the test patterns of table 1300, the resulting safe transition graph 1500 is shown in FIG. 15.

Now that a safe transition graph 1500 has been constructed (step 1010), well-known graph techniques are used to find a path that connects as many vertices as possible (step 1020). From safe transition graph 1500, a path from 1-2-4-7-6-5-3 results in all vertices being visited. Test patterns Test1–Test7 are then reordered according to this ordering (step 1030). At this point there are not disjoint paths in the safe transition graph (step 1030=NO), so method 1000 is done. Note that pattern 7 connects to all other vertices in the graph. The path 1-7-2-7-3-7-4-7-5-7-6 represents the sequence that results from placing the safe test pattern Test7 between the other test patterns, as disclosed herein in the description of the first embodiment. The second embodiment would have created sequence 1-2-x-3-4-y-5-6-7, where x and y are safe patterns generated by method 800 of FIG. 8. This simple example illustrates how the reordering of test patterns in accordance with the third embodiment may eliminate many or all of the unsafe transitions in a sequence of test patterns.

The preferred embodiments disclosed herein all eliminate contention during boundary scan testing. In the first embodiment, a single safe pattern is generated that puts all nets in a high impedance state, and this safe pattern is inserted between each pair of test patterns. In the second embodiment, the test patterns are analyzed, the unsafe transitions are identified, and a safe pattern is created and inserted between the patterns that create the unsafe transitions. In the third embodiment, the test patterns are first reordered by creating a safe transition graph. If parts of the graph remain disjoint, they can be joined by creating one or more safe patterns that are inserted between test patterns that create an unsafe transition.

While the invention has been particularly shown and described with reference to preferred embodiments thereof, it will be understood by those skilled in the art that various changes in form and details may be made therein without departing from the spirit and scope of the invention. For example, while the goal of the present invention is to eliminate all contention during boundary scan testing, it is equally within the scope of the present invention to eliminate less than all of the contention. Some nets may be more critical than others, so eliminating contention on a subset of the nets is anticipated by the present invention.

I claim:

1. A method for generating from a first sequence of test patterns a second sequence of test patterns, each test pattern defining a set of drivers and a value for each of a plurality of nets, the method comprising the steps of:

generating at least one safe test pattern for insertion between at least two test patterns in the first sequence of test patterns; and inserting the at least one safe test pattern into the first sequence of test patterns to generate the second sequence of test patterns.

2. The method of claim 1 further comprising the step of:

inserting the at least one safe test pattern between adjacent test patterns in the first sequence of test patterns to generate the second sequence of test patterns.

3. The method of claim 1 further comprising the steps of:

identifying first and second adjacent test patterns in the first sequence of test patterns that will potentially cause contention during boundary scan testing when switching from the first test pattern to the second test pattern; and inserting the at least one safe test pattern between the first and second adjacent test patterns.

4. The method of claim 3 wherein the identifying step comprises the steps of:

determining that the transition from the first test pattern to the second test pattern will potentially cause contention if all of the following are true for at least one net N in the first and second test patterns:

(a) the set of drivers driving net N in the first test pattern is different from the set of drivers driving net N in the second test pattern;

(b) the value of net N in the first test pattern causes net N to be driven to a first logic level; and (c) the value of net N in the second test pattern causes net N to be driven to a second logic level opposite the first logic level.

5. The method of claim 1 wherein the safe test pattern is dynamically generated from a first test pattern and a second test pattern that comprise two of the at least two test patterns.

6. The method of claim 5 wherein the dynamic generation of the safe test pattern comprises the steps of:

for each net N in the first and second test patterns:
   determining the set of drivers for net N in the first test pattern;
   determining the set of drivers for net N in the second test pattern;
   determining the value for net N in the fist test pattern;
   determining the value for net N in the second test pattern;
   generating the safe test pattern according to the sets of drivers and values for net N in the first and second test patterns.

7. The method of claim 5 wherein the dynamic generation of the safe test pattern comprising the steps of:

for each net N in the first and second test patterns:
   (A) determining whether it is desirable to put the net N in a high impedance state;
   (B) if it is desirable to put the net N in a high impedance state, the safe pattern for net N comprising a high impedance value and an empty set of drivers;
   (C) if it is not desirable to put the net N in a high impedance state, performing the following steps:
      (C1) if the value of the first test pattern for net N is equal to the value of the second test pattern for net N:
         (C1a) if the set of drivers driving net N in the first test pattern is the same as the set of drivers driving net N in the second test pattern,
            (C1a1) if the value for net N in the safe test pattern is to change values,
               (C1a1a) setting the value of the safe test pattern for net N to the complement of the value for net N in the second test pattern;
               (C1a1b) setting the set of drivers for net N in the safe test pattern to the set of drivers for net N in the second test pattern;
            (C1a2) if the value for net N in the safe test pattern is to stay the same as the value for net N in the first and second test patterns,
               (C1a2a) setting the value of the safe test pattern for net N to the value for net N in the second test pattern;
               (C1a2b) setting the set of drivers for net N in the safe test pattern to any non-empty set of drivers for net N;
         (C1b) if the set of drivers driving net N in the first test pattern is different from the set of drivers driving net N in the second test pattern,
            (C1b1) setting the value of the safe test pattern for net N to the value for net N in the second test pattern;
            (C1b2) setting the set of drivers for net N in the safe test pattern to any non-empty set of drivers for net N;
      (C2) if the value of the first test pattern for net N is different than the value of the second test pattern for net N:
         (C2a) if the set of drivers driving net N in the first test pattern is the same as the set of drivers driving net N in the second test pattern,
            (C2a1) setting the value of the safe test pattern for net N to one of the values of the first and second test patterns for net N;
            (C2a2) setting the set of drivers for net N in the safe test pattern to the set of drivers for net N in the second test pattern;
         (C2b) if the set of drivers driving net N in the first test pattern is different from the set of drivers driving net N in the second test pattern,
            (C2b1) if the set of drivers is to change from the first test pattern to the safe test pattern,
               (C2b1a) setting the value of the safe test pattern for net N to the value for net N in the first test pattern;
               (C2b1b) setting the set of drivers for net N in the safe test pattern to the set of drivers for net N in the second test pattern;
            (C2b2) if the value driven on net N is to change from the first test pattern to the safe test pattern,
               (C2b1a) setting the value of the safe test pattern for net N to the value for net N in the second test pattern;
               (C2b1b) setting the set of drivers for net N in the safe test pattern to the set of drivers for net N in the first test pattern.

8. The method of claim 1 further comprising the step of:
reordering the first sequence of test patterns to eliminate at least one potential contention between adjacent test patterns during boundary scan testing.

9. The method of claim 1 wherein the second sequence of test patterns does not cause any potential contention during boundary scan testing.

10. The method of claim 1 further comprising the steps of:
constructing a safe transition graph by placing into the graph a plurality of vertices, each vertex corresponding to a test pattern in the first sequence of test patterns, two vertices being connected by an edge if the transition between the two test patterns corresponding to the vertices will not potentially cause contention during boundary scan testing;
determining at least one path that connects a plurality of vertices along edges; and
reordering the test patterns corresponding to the plurality of vertices according to the order of the at least one path.

11. The method of claim 10 further comprising the step of:
if there exist multiple disjoint paths in the safe transition graph, generating at least one safe test pattern and inserting at least one vertex corresponding to the at least one safe test pattern into the safe transition graph to connect the disjoint paths.

12. A method for generating from a first sequence of test patterns a second sequence of test patterns, each test pattern defining a set of drivers and a value for each of a plurality of nets, the method comprising the step of:
(A) reordering the first sequence of test patterns to eliminate at least one potential contention between adjacent test patterns during boundary scan testing.

13. The method of claim 12 further comprising the steps of:
(B) identifying first and second adjacent test patterns in the first sequence of test patterns that will potentially cause contention during boundary scan testing when switching from the first test pattern to the second test pattern;
(C) generating at least one safe test pattern for insertion between the first and second adjacent test patterns; and
(D) inserting the at least one safe test pattern between the first and second adjacent test patterns.

14. The method of claim 13 wherein the identifying step comprises the steps of:

determining that the transition from the first test pattern to the second test pattern will potentially cause contention if all of the following are true for at least one net N in the first and second test patterns:

(a) the set of drivers driving net N in the first test pattern is different from the set of drivers driving net N in the second test pattern;

(b) the value of net N in the first test pattern causes net N to be driven to a first logic level; and (c) the value of net N in the second test pattern causes net N to be driven to a second logic level opposite the first logic level.

15. The method of claim 13 further comprising the step of:

(E) performing steps (B), (C) and (D) for each pair of adjacent test patterns in the first sequence that will potentially cause contention during boundary scan testing when switching from a first test pattern in the pair to a second test pattern in the pair.

16. The method of claim 12 further comprising the steps of:

constructing a safe transition graph by placing into the graph a plurality of vertices, each vertex corresponding to a test pattern in the first sequence of test patterns, two vertices being connected by an edge if the transition between the two test patterns corresponding to the vertices will not potentially cause contention during boundary scan testing;

determining at least one path that connects a plurality of vertices along edges; and reordering the test patterns corresponding to the plurality of vertices according to the order of the at least one path.

17. The method of claim 16 further comprising the step of:

if there exist multiple disjoint paths in the safe transition graph, generating at least one safe test pattern and inserting at least one vertex corresponding to the at least one safe test pattern into the safe transition graph to connect the disjoint paths.

18. A method for avoiding contention during boundary scan testing, the method comprising the steps of:

generating at least one safe test pattern for insertion between at least two test patterns in a first sequence of test patterns, each test pattern defining a set of drivers and a value for each of a plurality of nets; and inserting the at least one safe test pattern into the first sequence of test patterns to generate a second sequence of test patterns that are applied during the boundary scan testing.

19. The method of claim 18 further comprising the step of:

inserting the at least one safe test pattern between adjacent test patterns in the first sequence of test patterns to generate the second sequence of test patterns.

20. The method of claim 18 further comprising the steps of:

identifying first and second adjacent test patterns in the first sequence of test patterns that will potentially cause contention during boundary scan testing when switching from the first test pattern to the second test pattern; and inserting the at least one safe test pattern between the first and second adjacent test patterns.

21. The method of claim 20 wherein the identifying step comprises the steps of:

determining that the transition from the first test pattern to the second test pattern will potentially cause contention if all of the following are true for at least one net N in the first and second test patterns:

(a) the set of drivers driving net N in the first test pattern is different from the set of drivers driving net N in the second test pattern;

(b) the value of net N in the first test pattern causes net N to be driven to a first logic level; and (c) the value of net N in the second test pattern causes net N to be driven to a second logic level opposite the first logic level.

22. The method of claim 18 further comprising the step of:

reordering the first sequence of test patterns to eliminate at least one potential contention between adjacent test patterns during boundary scan testing.

23. The method of claim 18 further comprising the steps of:

constructing a safe transition graph by placing into the graph a plurality of vertices, each vertex corresponding to a test pattern in the first sequence of test patterns, two vertices being connected by an edge if the transition between the two test patterns corresponding to the vertices will not cause contention during boundary scan testing;

determining a path that connects a plurality of vertices along edges; and reordering the test patterns corresponding to the plurality of vertices according to the order of the path.

24. The method of claim 23 further comprising the step of:

if there exist multiple disjoint paths in the safe transition graph, generating at least one safe test pattern and inserting at least one vertex corresponding to the at least one safe test pattern into the safe transition graph to connect the disjoint paths.

25. The method of claim 18 further comprising the step of:

performing the boundary scan testing using the second sequence of test patterns.

26. A method for determining whether the transition from a first test pattern to a second test pattern will potentially cause contention during boundary scan testing, each test pattern defining a set of drivers and a value for each of a plurality of nets, the method comprising the steps of:

determining that the transition from the first test pattern to the second test pattern will potentially cause contention if all of the following are true for at least one net N in the first and second test patterns:

(a) the set of drivers driving net N in the first test pattern is different from the set of drivers driving net N in the second test pattern;

(b) the value of net N in the first test pattern causes net N to be driven to a first logic level; and (c) the value of net N in the second test pattern causes net N to be driven to a second logic level opposite the first logic level.

* * * * *